United States Patent
Machac, Jr. et al.

(10) Patent No.: US 6,586,164 B2
(45) Date of Patent: Jul. 1, 2003

(54) ALTERNATIVE PHOTORESIST STRIPPING SOLUTIONS

(75) Inventors: James R. Machac, Jr., Lago Vista, TX (US); Edward T. Marquis, Austin, TX (US); Wheeler C. Crawford, Houston, TX (US)

(73) Assignee: Huntsman Petrochemical Corporation, Austin, TX (US)

( * ) Notice: Subject to any disclaimer, the term of this patent is extended or adjusted under 35 U.S.C. 154(b) by 0 days.

(21) Appl. No.: 10/164,793

(22) Filed: Jun. 6, 2002

(65) Prior Publication Data

US 2002/0155393 A1 Oct. 24, 2002

Related U.S. Application Data

(60) Division of application No. 09/946,313, filed on Sep. 5, 2001, now Pat. No. 6,475,708, which is a continuation-in-part of application No. 09/606,465, filed on Jun. 29, 2000, now abandoned.

(51) Int. Cl.[7] .................................................. G03F 7/42
(52) U.S. Cl. ........................ 430/331; 430/329; 510/176
(58) Field of Search ................................. 430/329, 331; 510/176

(56) References Cited

U.S. PATENT DOCUMENTS

| | | | | |
|---|---|---|---|---|
| 4,438,192 A | | 3/1984 | Archer et al. ............... | 430/329 |
| 4,483,917 A | | 11/1984 | Archer et al. ............... | 430/329 |
| 4,791,043 A | | 12/1988 | Thomas et al. ............. | 430/256 |
| 4,806,458 A | | 2/1989 | Durham ...................... | 430/331 |
| 4,824,763 A | | 4/1989 | Lee ............................. | 430/258 |
| 4,940,651 A | | 7/1990 | Brown et al. ............... | 430/325 |
| 4,948,697 A | | 8/1990 | Durham ...................... | 430/165 |
| 5,102,777 A | | 4/1992 | Lin et al. .................... | 430/331 |
| 5,268,260 A | | 12/1993 | Bantu et al. ................ | 430/325 |
| 5,690,747 A | | 11/1997 | Doscher ......................... | 134/1 |
| 5,721,204 A | * | 2/1998 | Maxwell et al. ............ | 510/206 |
| 5,789,359 A | * | 8/1998 | Shimozawa et al. ........ | 510/175 |
| 6,040,284 A | | 3/2000 | Marquis et al. ............. | 510/201 |
| 6,169,061 B1 | | 1/2001 | Machac, Jr. et al. ........ | 510/201 |
| 6,420,327 B1 | * | 7/2002 | Machac et al. ............. | 510/176 |

* cited by examiner

Primary Examiner—Richard L. Schilling
(74) Attorney, Agent, or Firm—Russ R. Stolle; Ron D. Brown; Christopher J. Whewell

(57) ABSTRACT

The present invention is directed toward effective photoresist stripping compositions that are less corrosive and do not cause skin irritation. One form of the present invention is a composition useful as a photoresist remover that includes an alkylene carbonate, and one or more additional components chosen from the group that includes alkyl hydrogen peroxides, hydroxyalkyl ureas, urea-hydrogen peroxides, N-substituted morpholines and alcohols. Another form of the present invention is a composition for removing photoresist from a surface that includes an N-substituted morpholine.

1 Claim, No Drawings

ALTERNATIVE PHOTORESIST STRIPPING SOLUTIONS

CROSS-REFERENCES TO RELATED APPLICATIONS

This invention claims priority to, and is a divisional application of U.S. Ser. No. 09/946,313 filed Sep. 5, 2001, now U.S. Pat. No. 6,475,708, which itself was a continuation-in-part of application Ser. No. 09/606,465 filed Jun. 29, 2000, now abandoned, the entire contents of which applications are herein incorporated fully by reference thereto.

TECHNICAL FIELD

This invention relates to photoresist stripping compositions, and, more particularly, to carbonate-based photoresist stripping compositions and methods of use thereof.

BACKGROUND OF THE INVENTION

Photolithography is a process that is used in manufacturing integrated circuits, whereby the pattern of the integrated circuit is imprinted on a wafer, a thin slice of a semiconductor material. The pattern is imprinted on the wafer by first coating the wafer with a photoresist, placing a mask that contains the desired pattern over the coated wafer, and then exposing the wafer to light. If a positive resist is being used, the portion of the exposed resist (i.e. the portion not covered by the mask) will react with the light, and become more soluble in the photoresist remover. After sufficient light exposure, the wafer is then washed with a photoresist remover, which removes the portion of the photoresist that corresponds to the pattern on the mask. Alternatively, if a negative resist is used, the exposed portion of the resist will react with the light to become polymerized, and, hence, insoluble in the photoresist remover. After sufficient light exposure, the wafer is then washed with a photoresist remover, which removes the portion of the photoresist that corresponds to the inverse pattern on the mask.

Numerous photoresist remover compositions have been developed. These include a solution for removing photoresist that is made up of at least one aprotic, alicyclic carbonate and at least one aprotic, polar compound that is used in conjunction with ultrasonic agitation. Other photoresist strippers are composed of common solvents such as methylene chloride, methanol, and methyl formate. Still other compositions are made up of a hexa-alkyl disilazanes and another solvent such as propylene glycol monoalkyl ether or propylene glycol mono-alkyl ether acetate. Compositions containing aliphatic as well as aromatic amines, amides and lactones have also been used to remove photoresistive materials.

Unfortunately, many conventional photoresist stripper compositions contain components that are corrosive or skin irritants. Therefore, a need exists for effective photoresist stripper compositions that are less corrosive and do not cause skin irritation.

SUMMARY OF THE INVENTION

Accordingly, the present invention is directed toward effective photoresist stripping compositions that are less corrosive and do not cause skin irritation.

One form of the present invention is a composition useful as a photoresist remover that includes an alkylene carbonate, and one or more additional components chosen from the group that includes alkyl hydrogen peroxides, hydroxyalkyl ureas, urea-hydrogen peroxides, N-substituted morpholines and alcohols. Another form of the present invention is a composition for removing photoresist from a surface that includes an N-substituted morpholine.

Another form of the present invention is a method for removing photoresist from a surface including the steps of contacting the surface with an effective amount of a composition that made up of an alkylene carbonate, and one or more additional components chosen from the group including of an alkyl hydrogen peroxide, a hydroxyalkyl urea, a urea-hydrogen peroxide, an N-substituted morpholine, and an alcohol, and then allowing the composition to contact the surface for a period of time and under conditions effective to cause the removal of the photoresist from the surface.

DETAILED DESCRIPTION

In one embodiment, the present invention provides for compositions useful as photoresist removers. These compositions comprise an alkylene carbonate, and one or more additional components chosen from the group made up of alkyl hydrogen peroxides, hydroxyalkyl ureas, urea-hydrogen peroxides, N-substituted morpholines, and alcohols. The compositions may also further comprise water. The compositions of the present invention are as effective as conventional photoresist strippers. In addition, because the compositions of the present invention are alkylene carbonate-based, solvent loss is minimal during use because of the high boiling point associated with alkylene carbonates.

Generally, the compositions of the present invention comprise at least about 50% by weight of an alkylene carbonate, from about 0% to about 50% by weight of one or more additional components chosen from the group consisting of an alkyl hydrogen peroxide, a hydroxyalkyl urea, a urea-hydrogen peroxide, an N-substituted morpholine, and an alcohol. Optionally, the compositions may also comprise up to about 80% by weight of water, or alkyl hydrogen peroxide, or mixtures thereof. Preferably, the compositions of the present invention comprise at least about 50% by weight of an alkylene carbonate, and more preferably, at least about 75% by weight of an alkylene carbonate.

The alkylene carbonate used in the present invention may be any number of alkylene carbonates or mixtures thereof. Suitable alkylene carbonates have from about two to about eight carbon atoms. Preferably, the alkylene carbonate comprises ethylene carbonate, propylene carbonate, butylene carbonate, or mixtures thereof. More preferably, the alkylene carbonate comprises propylene carbonate.

The alcohol used in the present invention may be any number of alcohols. Suitable alcohols include 2-(2-aminoethoxy)ethanol, benzyl alcohol, isopropyl alcohol, methanol, or ethanol.

The alkyl hydrogen peroxide used in the present invention may include any such compound that is stable under the conditions used to remove the photoresist material. Tertiary butyl peroxide is a preferred example of such a compound useful in preparations in accordance with the present invention.

The photoresist removal compositions of the present invention may be used to remove positive or negative photoresist from a variety of surfaces. Preferably, the photoresist removal compositions of the present invention are used to remove negative photoresist from a surface. Such surfaces may include, but are not limited to, aluminum, copper, silicon, or derivatives thereof.

In another embodiment, the present invention provides for a method of removing photoresist from a surface. The method involves contacting the surface with a composition made up of an alkylene carbonate and one or more additional components chosen from the group made up of an alkyl hydrogen peroxide, a hydroxyalkyl urea, a urea-hydrogen peroxide, an N-substituted morpholine, and an alcohol and, optionally, water, and allowing the composition to contact the surface for a period of time, and under conditions effective to cause stripping of the photoresist. Optionally, the composition may be heated. Preferably, the composition is at a temperature from about 20° C. to about 50° C. when the surface is contacted with said composition. More preferably, the composition is at a temperature from about 25° C. to about 45° C. when the surface is contacted with said composition.

According to the method of the present invention, the composition may be contacted with the photoresist coated surface using any suitable method. Preferably, the composition is contacted with the photoresist coated surface by immersing the surface in the composition.

A variety of factors may influence the amount of time it takes the composition to remove the photoresist from the surface. Such factors may include temperature, photoresist type, photoresist thickness, etc. In general, the stripping times may vary from less than about 50 seconds to about 10 minutes, although longer stripping times may be observed, depending on the conditions.

The following examples are illustrative of the present invention, and are not intended to limit the scope of the invention in any way.

The following photoresist remover compositions exemplify some of the subject matter of the present invention. Beakers were filled with each of the composition below, and heated to about 45° C. Then, two-inch square printed circuit boards that were coated with a negative photoresist were placed in each beaker. The stripping time for each sample was visually observed.

EXAMPLE 1

A mixture of 75 weight percent propylene carbonate and 25 weight percent tertiary butyl hydrogen peroxide was applied to a wire board having a layer of photoresist. The procedure was performed at 45° C. and the photoresist material was removed in 2 minutes and 50 seconds.

EXAMPLE 2

Pure propylene carbonate was applied to a surface similar to that in example 1. The procedure was performed at 45° C. and the photoresist material was removed in 3 minutes and 50 seconds.

EXAMPLE 3

A mixture of 50 weight percent propylene carbonate and 50 weight percent hydroxyethyl urea was applied to a surface similar to that in example 1. The procedure was performed at 45° C. and the photoresist material was removed in 3 minutes and 50 seconds.

EXAMPLE 4

A mixture of 75 weight hydroxyethyl urea and 25 weight percent water was applied to a surface similar to that in example 1. The procedure was performed at 45° C. and the solution failed to strip the photoresist material.

EXAMPLE 5

Pure 2-(2-aminoethoxy)ethanol was applied to a surface similar to that in example 1. The procedure was performed at 45° C. and the photoresist material was removed in 4 minutes and 30 seconds.

EXAMPLE 6

A mixture of 75 weight percent 2-(2-aminoethoxy)ethanol and 25 weight percent tertiary butyl hydrogen peroxide was applied to a surface similar to that in example 1. The procedure was performed at 45° C. and the photoresist material was removed in 4 minutes and 20 seconds.

EXAMPLE 7

A mixture of 97 weight percent 2-(2-aminoethoxy)ethanol and 3 weight percent urea hydrogen peroxide was applied to a surface similar to that in Example 1. The procedure was performed at 45° C. and the photoresist material was removed in 6 minutes.

EXAMPLE 8

A mixture of 97 weight percent ZR-70, 2-(2-dimethylaminoethoxy)ethanol, and 3 weight percent urea hydrogen peroxide was applied to a surface similar to that in example 1. The procedure was performed at 45° C. and the photoresist material was removed in 10 minutes and 43 seconds.

EXAMPLE 9

A mixture of 50 weight percent N-formyl morpholine and 50 weight percent propylene glycol methyl ether was applied to a surface similar to that in example 1. The procedure was performed at 45° C. and the photoresist material was removed in 3 minutes 20 seconds.

EXAMPLE 10

A mixture of 50 weight percent N-formyl morpholine and 50 weight percent isopropyl alcohol was applied to a surface similar to that in example 1. The procedure was performed at 45° C. and the photoresist material was removed in 4 minutes 15 seconds.

EXAMPLE 11

Pure N-formyl morpholine was applied to a surface similar to that in example 1. The procedure was performed at 45° C. and the photoresist material was removed in 5 minutes 19 seconds.

EXAMPLE 12

A mixture of 50 weight percent N-formyl morpholine and 50 weight percent benzyl alcohol was applied to a surface similar to that in example 1. The procedure was performed at 45° C. and the photoresist material was removed in 2 minutes 53 seconds.

EXAMPLE 13

A mixture of 80 weight percent N-formyl morpholine and 20 weight percent water was applied to a surface similar to that in example 1. No stripping was observed at 45° C.

EXAMPLE 14

A mixture of 50 weight percent N-formyl morpholine and 50 weight percent 2-(2-aminoethoxy)ethanol was applied to a surface similar to that in example 1. The procedure was performed at 45° C. and the photoresist material was removed in 5 minutes 13 seconds.

EXAMPLE 15

A mixture of 50 weight percent N-formyl morpholine and 50 weight percent propylene carbonate was applied to a surface similar to that in example 1. The procedure was performed at 45° C. and the photoresist material was removed in 4 minutes 14 seconds.

EXAMPLE 16

A mixture of 50 weight percent N-formyl morpholine and 50 weight percent tertiary butyl peroxide was applied to a surface similar to that in example 1. The procedure was performed at 45° C.

EXAMPLE 17

A mixture of 50 weight percent N-formyl morpholine and 50 weight percent hydrogen peroxide was applied to a surface similar to that in example 1. The procedure was performed at 45° C.

EXAMPLE 18

A mixture of 50 weight percent N-formyl morpholine and 20 weight percent tertiary butyl peroxide, and 30 weight percent limonene was applied to a surface similar to that in example 1. The procedure was performed at 45° C.

EXAMPLE 19

A mixture of 50 weight percent N-formyl morpholine and 20 weight percent tertiary butyl peroxide and 30 percent hexane was applied to a surface similar to that in example 1. The procedure was performed at 45° C.

Although illustrative embodiments have been shown and described, a wide range of modification, changes, and substitution is contemplated in the foregoing disclosure. In some instances, some features of the disclosed embodiments may be employed without a corresponding use of the other features. Accordingly, it is appropriate that the appended claims be construed broadly and in a manner consistent with the scope of the invention.

What is claimed is:

1. A composition useful as a photoresist remover that comprises N-formyl morpholine and 2-(2-aminoethoxy) ethanol, wherein 2-(2-aminoethoxy)ethanol is present in any amount between 0.1% and 60.0% by weight based upon the total weight of said composition.

* * * * *